(12) United States Patent
Kitamura et al.

(10) Patent No.: US 7,883,631 B2
(45) Date of Patent: Feb. 8, 2011

(54) PLASMA ETCHING METHOD, PLASMA ETCHING APPARATUS, CONTROL PROGRAM AND COMPUTER-READABLE STORAGE MEDIUM

(75) Inventors: Akinori Kitamura, Nirasaki (JP); Masanobu Honda, Nirasaki (JP); Nozomi Hirai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 523 days.

(21) Appl. No.: 11/682,527

(22) Filed: Mar. 6, 2007

(65) Prior Publication Data

US 2007/0212887 A1 Sep. 13, 2007

Related U.S. Application Data

(60) Provisional application No. 60/781,344, filed on Mar. 13, 2006.

(30) Foreign Application Priority Data

Mar. 7, 2006 (JP) .............................. 2006-060613

(51) Int. Cl.
*B44C 1/22* (2006.01)
(52) U.S. Cl. ........................................ 216/67; 438/706
(58) Field of Classification Search .................... 216/67
See application file for complete search history.

(56) References Cited

U.S. PATENT DOCUMENTS

| 4,671,849 | A | * | 6/1987 | Chen et al. | .................. 438/713 |
| 6,106,737 | A | * | 8/2000 | Tomoyasu et al. | ............ 216/67 |
| 6,800,210 | B2 | * | 10/2004 | Patel et al. | ...................... 216/2 |
| 7,153,779 | B2 | * | 12/2006 | Trapp | ......................... 438/706 |

OTHER PUBLICATIONS

Wolf et al. (Silicon Processing for the VLSI Era; vol. 1; 1986; Lattice Press).*
Kawais et al.; published 1980JP-174706 (Dec. 12, 1980); Patent: JP 86054214 B.*

* cited by examiner

*Primary Examiner*—Keith D Hendricks
*Assistant Examiner*—Patricia A George
(74) *Attorney, Agent, or Firm*—Oblon, Spivak, McClelland, Maier & Neustadt, L.L.P.

(57) ABSTRACT

A plasma etching method includes the step of performing a plasma etching on a silicon-containing dielectric layer formed on a substrate to be processed by using a plasma, while using an organic layer as a mask. In addition, the plasma is generated from a processing gas at least including a first fluorocarbon gas which is an unsaturated gas; a second fluorocarbon gas which is an aliphatic saturated gas expressed by $C_mF_{2m+2}$ (m=5, 6); and an oxygen gas. Further, a computer-readable storage medium for storing therein a computer executable control program is provided where the control program, when executed, controls a plasma etching apparatus to perform the above plasma etching method.

11 Claims, 3 Drawing Sheets

PLASMA ETCHING METHOD, PLASMA ETCHING APPARATUS, CONTROL PROGRAM AND COMPUTER-READABLE STORAGE MEDIUM

FIELD OF THE INVENTION

The present invention relates to a plasma etching method for etching a silicon-containing dielectric layer formed on a substrate to be processed by using an organic layer as a mask; and also relates to a plasma etching apparatus, a control program to be used therefor, and a computer-readable storage medium storing the control program therein.

BACKGROUND OF THE INVENTION

In a manufacturing process of semiconductor devices, a plasma etching is performed on a silicon-containing dielectric layer (for instance, a $SiO_2$ film, a SiOC film, or the like) by using an organic layer such as a photoresist as a mask, to thereby form, for example, contact holes. In general, a gaseous mixture of, for example, $C_4F_6/Ar/O_2$ is employed as a processing gas for plasma generation in the plasma etching. (see, for example, Patent Reference 1).

Further, there has been proposed using a processing gas containing a fluorocarbon gas at least having four carbon atoms with a F/C ratio equal to or smaller than a value of 2; an argon or xenon gas; and an oxygen gas to perform a plasma etching of $SiO_2$ selectively against a photoresist (see, for example, Patent Reference 2).

[Patent Reference 1]

Japanese Patent Laid-open Application No. 2002-231596

[Patent Reference 2]

Japanese Patent Laid-open Application No. 2004-512668

When forming contact holes of high aspect ratios by using an organic layer such as a photoresist as a mask, a high selectivity of a target layer to be etched against the mask is required. The necessity to meet such a requirement is getting stronger in order to achieve a thickness reduction of a mask layer, while improving productivity. Further, there is an increasing demand for achieving a high etching rate as well as the demand for maintaining the selectivity high. Thus, a plasma etching method capable of satisfying both the high selectivity and high etching rate is required to be developed.

SUMMARY OF THE INVENTION

It is, therefore, an object of the present invention to provide a plasma etching method capable of satisfying a high selectivity and a high etching rate; and also provide a plasma etching apparatus, a control program to be used therefor, and a computer-readable storage medium storing the control program therein.

In accordance with a first aspect of the present invention, there is provided a plasma etching method including the step of: performing a plasma etching on a silicon-containing dielectric layer formed on a substrate to be processed by using a plasma, while using an organic layer as a mask, wherein the plasma is generated from a processing gas at least including a first fluorocarbon gas which is an unsaturated gas; a second fluorocarbon gas which is an aliphatic saturated gas expressed by $C_mF_{2m+2}$ (m=5, 6); and an oxygen gas.

Further, the first fluorocarbon gas may be $C_4F_6$ and the second fluorocarbon gas may be $C_5F_{12}$, and a flow rate ratio between the $C_4F_6$, the $C_5F_{12}$ and the oxygen gas may be about 2:1:2.0 to 2.4.

Further, the first fluorocarbon gas may be $C_4F_6$ and the second fluorocarbon gas may be $C_6F_{14}$, and a flow rate ratio between the $C_4F_6$, the $C_6F_{14}$ and the oxygen gas may be about 2:1:2.2 to 2.6.

Further, the organic layer may be a photoresist layer, and the silicon-containing dielectric layer may be a silicon oxide layer.

Further, the processing gas may further contain a rare gas.

Further, the rare gas may be an argon gas.

Further, the plasma etching may be performed, in a processing chamber having a lower electrode for mounting the substrate to be processed thereon and an upper electrode disposed to face the lower electrode, by applying high frequency powers between the upper and the lower electrode.

Further, the high frequency powers may include a first high frequency power applied to the upper electrode; and a second high frequency power applied to the lower electrode. Further, a frequency of the second high frequency power may be lower than that of the first high frequency power.

In accordance with a second aspect of the present invention, there is provided a plasma etching apparatus including a processing chamber for accommodating therein a substrate to be processed; a processing gas supply unit for supplying a processing gas into the processing chamber; a plasma generating unit for converting the processing gas supplied from the processing gas supply unit into a plasma, thereby plasma-etching the substrate; and a control unit for performing the plasma etching method in the processing chamber.

In accordance with a third aspect of the present invention, there is provided a computer-executable control program, which controls, when executed, a plasma etching apparatus to perform the plasma etching method.

In accordance with a fourth aspect of the present invention, there is provided a computer-readable storage medium for storing therein a computer executable control program. Further, the control program, when executed, controls a plasma etching apparatus to perform the plasma etching method.

In accordance with the present invention, the plasma etching method, the plasma etching apparatus, and the control program and the computer-readable storage medium can be provided while satisfying a high selectivity and a high etching rate.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENTS

Figure 1A:
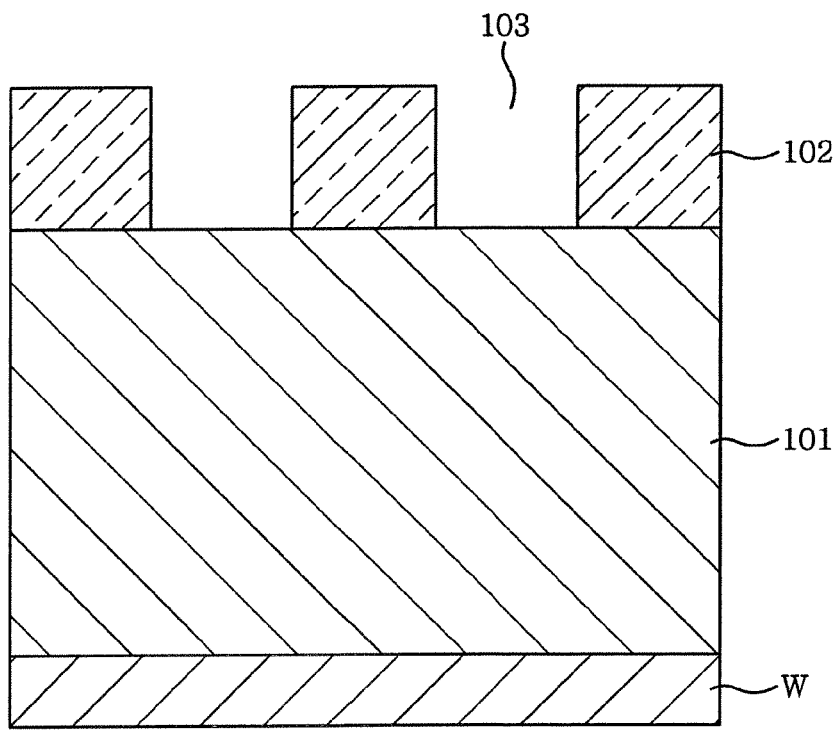
FIGS. 1A and 1B provide cross sectional views of a semiconductor wafer to which a plasma etching method in accordance with an embodiment of the present invention is applied.
Figure 1B:
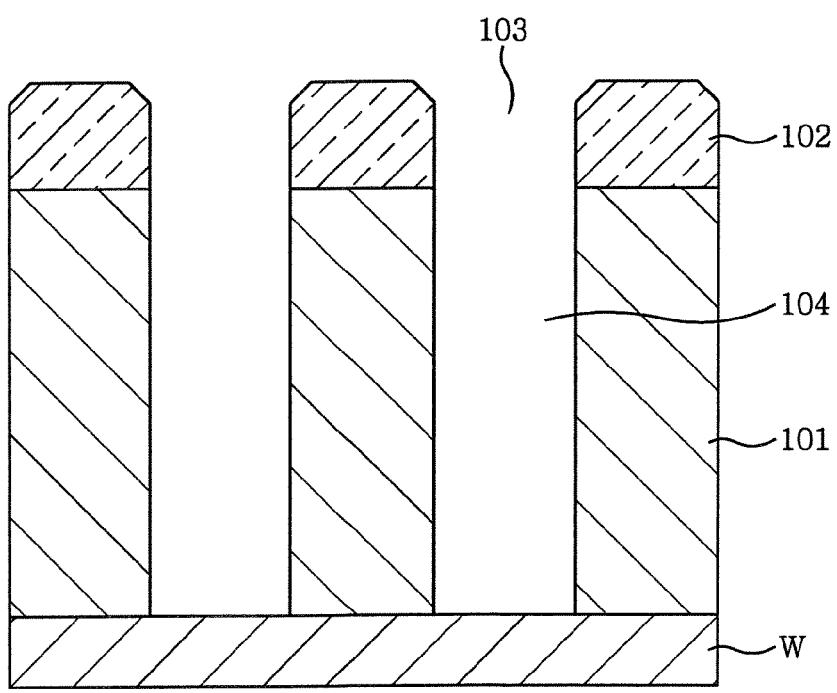

Hereinafter, an embodiment of the present invention will be described in detail with reference to the accompanying drawings. FIGS. 1A and 1B are enlarged cross sectional configuration views of a semiconductor wafer W which is used as a target object to be etched in a plasma etching method in accordance with an embodiment of the present invention.

Figure 2:
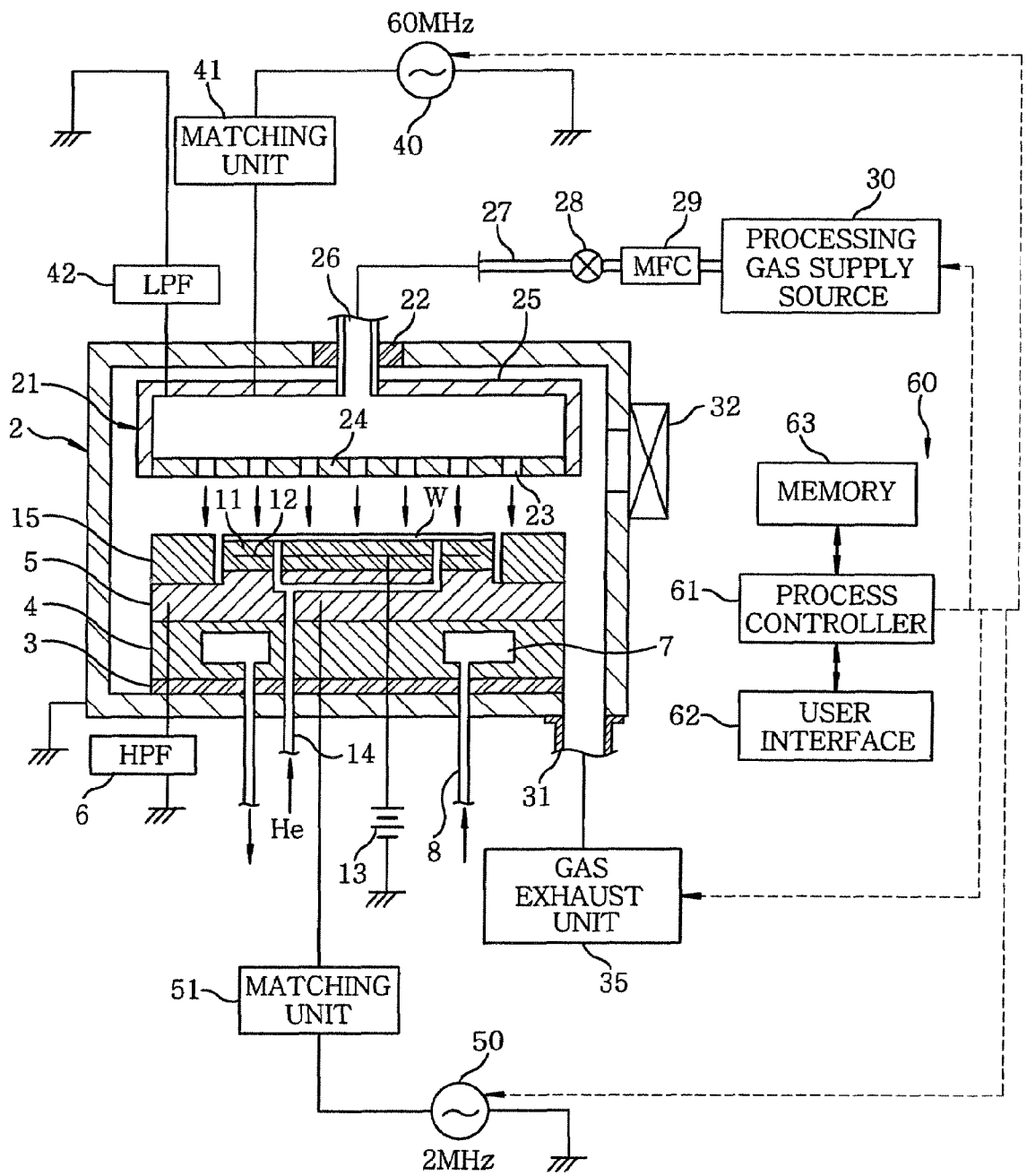
FIG. 2 sets forth a schematic configuration view of a plasma etching apparatus in accordance with the embodiment of the present invention.

FIG. 2 illustrates a cross sectional configuration of a plasma etching apparatus 1 in accordance with the embodiment of the present invention. Below, a configuration of the plasma etching apparatus 1 will be first explained with reference to FIG. 2.

A plasma etching apparatus 1 is configured as a capacitively coupled parallel plate type etching apparatus having an upper and a lower electrode plate placed to face each other in parallel and respectively connected to power supplies for plasma generation.

The plasma etching apparatus 1 has a cylindrical processing chamber (processing vessel) 2 formed of, for example, aluminum whose surface is anodically oxidized, and the chamber 2 is grounded. A substantially columnar susceptor support 4 for mounting thereon a target object to be processed, e.g., a semiconductor wafer W is installed at a bottom portion of the processing chamber 2 via an insulating plate 3 such as ceramic. Further, a susceptor 5 serving as a lower electrode is mounted on the susceptor support 4, and the susceptor 5 is connected to a high pass filter (HPF) 6.

A coolant path 7 is formed inside the susceptor support 4, and a coolant is introduced into the coolant path 7 via a coolant introducing line 8. By the circulation of the coolant through the coolant path 7, the cold heat of the coolant is transferred from the susceptor 5 to the semiconductor wafer W, whereby the processing surface of the wafer W is maintained at a desired temperature level.

The susceptor 5 has an upper central portion of a disk shape, which protrudes higher than its peripheral portion, and an electrostatic chuck 11 that is shaped substantially identical to the semiconductor wafer W is disposed on the upper central portion of the susceptor 5. The electrostatic chuck 11 includes an electrode 12 embedded in an insulating member. The semiconductor wafer W is electrostatically attracted to the electrostatic chuck 11 by, for example, a Coulomb force generated by applying a DC voltage of, for example, 1.5 kV to the electrode 12 from a DC power supply 13 connected thereto.

Further, formed through the insulating plate 3, the susceptor support 4, the susceptor 5 and the electrostatic chuck 11 is a gas channel 14 for supplying a heat transfer medium (e.g., a He gas), to the rear surface of the semiconductor wafer W. Thus, the cold heat of the susceptor 5 is transferred from the susceptor 5 to the semiconductor wafer W through the heat transfer medium, so that the wafer W is maintained at a specific temperature level.

An annular focus ring 15 is disposed on the periphery of the top surface of the susceptor 5 to surround the semiconductor wafer W loaded on the electrostatic chuck 11. The focus ring 15 is formed of a conductive material such as silicon and serves to improve uniformity of etching.

An upper electrode 21 is disposed above the susceptor 5, while facing it in parallel. The upper electrode 21 is supported at an upper portion of the processing chamber 2 via an insulating member 22. The upper electrode 21 includes an electrode plate 24; and an electrode support 25 that serves to support the electrode 24 and is made up of a conductive material. The electrode plate 24 is configured to face the susceptor 5 and is provided with a number of injection openings 23. The electrode plate 24 is formed of, for example, aluminum whose surface is anodically oxidized (alumite treated) with a quartz cover attached thereto. A distance between the susceptor 5 and the upper electrode 21 is variable.

A gas inlet port 26 is formed at a center of the electrode support 25 of the upper electrode 21, and a gas supply line 27 is coupled to a gas inlet port 26. Further, the gas supply line 27 is connected to a processing gas supply source 30 via a valve 28 and a mass flow controller 29.

A gas exhaust line 31 is connected to a bottom portion of the chamber 2 and coupled to a gas exhaust unit 35. The gas exhaust unit 35 includes a vacuum pump such as a turbo molecular pump, and serves to create a depressurized atmosphere in the processing chamber 2, i.e., to evacuate the chamber 2 such that the inner pressure thereof is reduced down to a specific vacuum level, e.g., 1 Pa or less. Further, a gate valve 32 is installed at a sidewall of the processing chamber 2. The wafer W is transferred between the processing chamber 2 and an adjacent load lock chamber (not shown) while the gate valve 32 is opened.

A first high frequency power supply 40 is connected to the upper electrode 21 via a matching unit 41. Further, a low pass filter (LPF) 42 is connected to the upper electrode 21. The first high frequency power supply 40 is of a frequency ranging from about 50 to 150 MHz. By applying a high frequency power in such a frequency range, a high-density plasma in a desirable dissociated state can be generated in the processing chamber 2.

Further, a second high frequency power supply 50 is connected to the susceptor 5 serving as the lower electrode via a matching unit 51. The second high frequency power supply 50 has a frequency range lower than that of the first high frequency power supply 40. By applying a power of a frequency in such a range, a proper ionic action can be facilitated without causing any damage on the wafer W, which is an object to be processed. Preferably, the frequency of the second high frequency power supply 50 is determined within a range from about 1 to 20 MHz.

The whole operation of the plasma etching apparatus 1 having the above-described configuration is controlled by a control unit 60. The control unit 60 includes a process controller 61 having a CPU for controlling each component of the plasma etching apparatus 1; a user interface 62; and a memory 63.

The user interface 62 includes a keyboard for a process manager to input a command to operate the plasma etching apparatus 1; a display for showing an operational status of the plasma etching apparatus 1; and the like.

Moreover, the memory 63 stores therein, e.g., control programs (software) and recipes including processing condition data and the like to be used in realizing various processes, which are performed in the plasma etching apparatus 1 under the control of the process controller 61. When a command is received from the user interface 62, the process controller 61 retrieves a necessary recipe from the memory 63 as required to execute the command to perform a desired process in the plasma etching apparatus 1 under the control of the process controller 61. The necessary recipe can be retrieved from a computer-readable storage medium (e.g., a hard disk, a CD-ROM, a flexible disk, a semiconductor memory, or the like), or can be transmitted from another apparatus via, e.g., a dedicated line, if necessary.

Hereinafter, a plasma etching method for selectively etching a silicon-containing dielectric layer (e.g., a $SiO_2$ layer, a SiOC layer, or the like) by using an organic layer (e.g., photoresist) as a mask will be explained, wherein the plasma etching method is performed by the plasma etching apparatus 1 configured as described above. First, the gate valve 32 is opened, and then the semiconductor wafer W is loaded into the processing chamber 2 via the load lock chamber (not shown) and mounted on the electrostatic chuck 11. Then, a DC voltage is applied to the electrode 12 from the DC power supply 13, whereby the semiconductor wafer W is electrostatically attracted to the electrostatic chuck 11. Subsequently, the gate valve 32 is closed, and then the processing chamber 2 is evacuated to a specific vacuum level by the gas exhaust unit 35.

Thereafter, the valve 28 is opened, and a processing gas (etching gas) is supplied into a hollow space of the upper electrode 21 via the gas supply line 27 and the gas inlet port 26 from the processing gas supply source 30 while its flow rate is controlled by the mass flow controller 29. Then, the processing gas is discharged uniformly toward the semiconductor wafer W through the injection openings 23 of the electrode plate 24, as indicated by arrows in FIG. 2.

Then, the internal pressure of the processing chamber 2 is maintained at a specific pressure level, and a high frequency power of a predetermined frequency is applied to the upper electrode 21 from the first high frequency power supply 40, whereby a high frequency electric field is generated between the upper electrode 21 and the susceptor 5 serving as the lower electrode. As a result, the processing gas is dissociated and converted into a plasma.

Meanwhile, a high frequency power of a frequency lower than that from the first high frequency power supply 40 is applied to the susceptor 5 serving as the lower electrode from the second high frequency power supply 50. As a result, ions among the plasma are attracted toward the susceptor 5, so that etching anisotropy is improved by ion assist.

Then, upon the completion of the plasma etching, the supply of the high frequency powers and the processing gas is stopped, and the semiconductor wafer W is retreated out of the processing chamber 2 in the reverse sequence as described above.

Below, the plasma etching method in accordance with the embodiment of the present invention will be described with reference to FIGS. 1A and 1B. As shown in FIG. 1A, on the surface of a semiconductor wafer W, which is a substrate to be processed, there is formed a $SiO_2$ layer 101 of a specific thickness (e.g., 2000 nm) to be used as a silicon-containing dielectric layer, and on the $SiO_2$ layer 101, there is formed a photoresist layer (e.g., a KrF resist, an ArF resist, an X-ray resist, or the like) 102 of a certain thickness (e.g., 660 nm) to be used as an organic layer. A preset pattern is transferred to the photoresist layer 102 by an exposure and developing process, whereby the photoresist layer 102 is formed as a mask having openings 103 of the preset pattern (e.g., a number of circular holes having diameters of 0.15 μm). The semiconductor wafer W in the state shown in FIG. 1A is loaded into the processing chamber 2 of the plasma etching apparatus 1.

In the processing chamber 2, the $SiO_2$ layer 101 is plasma etched selectively against the photoresist film 102 by using the photoresist film 102 as a mask, whereby holes 104 such as contact holes are formed as shown in FIG. 1B. This plasma etching is performed by a plasma generated from a processing gas containing at least a first fluorocarbon gas which is an unsaturated gas; a second fluorocarbon gas which is an aliphatic saturated gas written as $C_mF_{2m+2}$ (m=5, 6); and an oxygen gas.

As for the first fluorocarbon gas, $C_4F_6$ can be used, for example. In case the second fluorocarbon gas is $C_5F_{12}$, for example, a flow rate ratio between the $C_4F_6$, the $C_5F_{12}$, and the oxygen gas is preferably set to be about 2:1:2.0 to 2.4. Further, as the second fluorocarbon gas is $C_6F_{14}$, for example, a flow rate ratio between the $C_4F_6$, the $C_6F_{14}$ and the oxygen gas is preferably set to be about 2:1:2.2 to 2.6. A rare gas can be added to the above processing gas. As for the rare gas, Ne, Ar, Kr, Xe, or the like can be employed, for example, and particularly, Ar can be appropriately utilized. By using the processing gas having such a composition, a high selectivity and a high etching rate can be obtained.

TEST EXAMPLE 1

In Test Example 1, the above-explained plasma etching was performed on a semiconductor wafer W having a configuration as shown in FIG. 1 (photoresist film=660 nm, $SiO_2$ layer=2000 nm) by using the plasma etching apparatus 2 shown in FIG. 2 according to a processing recipe to be specified below, whereby holes 104 having diameters of 0.15 μm was formed.

The processing recipe for the test example was retrieved from the memory 63 of the control unit 60 and executed by the process controller 61. The process controller 61 controlled each component of the plasma etching apparatus 1 based on a control program, whereby an etching process was performed according to the retrieved recipe as follows:

etching gas: $C_4F_6/C_5F_{12}/Ar/O_2$=20/10/300/23 sccm;
pressure: 2.0 Pa (15 mTorr);
power (upper electrode/lower electrode): 2200 W (60 MHz)/1800 W (2 MHZ);
temperature (upper electrode/chamber sidewall/lower electrode): 60/50/−10° C.;
He pressure: 665/3325 Pa (5/25 Torr);
etching time: 160 seconds.

In the above plasma etching, an etching rate of the $SiO_2$ layer at a hole portion was 742 nm/min. Further, a selectivity of the $SiO_2$ layer against the photoresist (an etching rate of the $SiO_2$ layer/an etching rate of the photoresist) was estimated to be 4.7 at a shoulder portion (facet portion).

Figure 3:
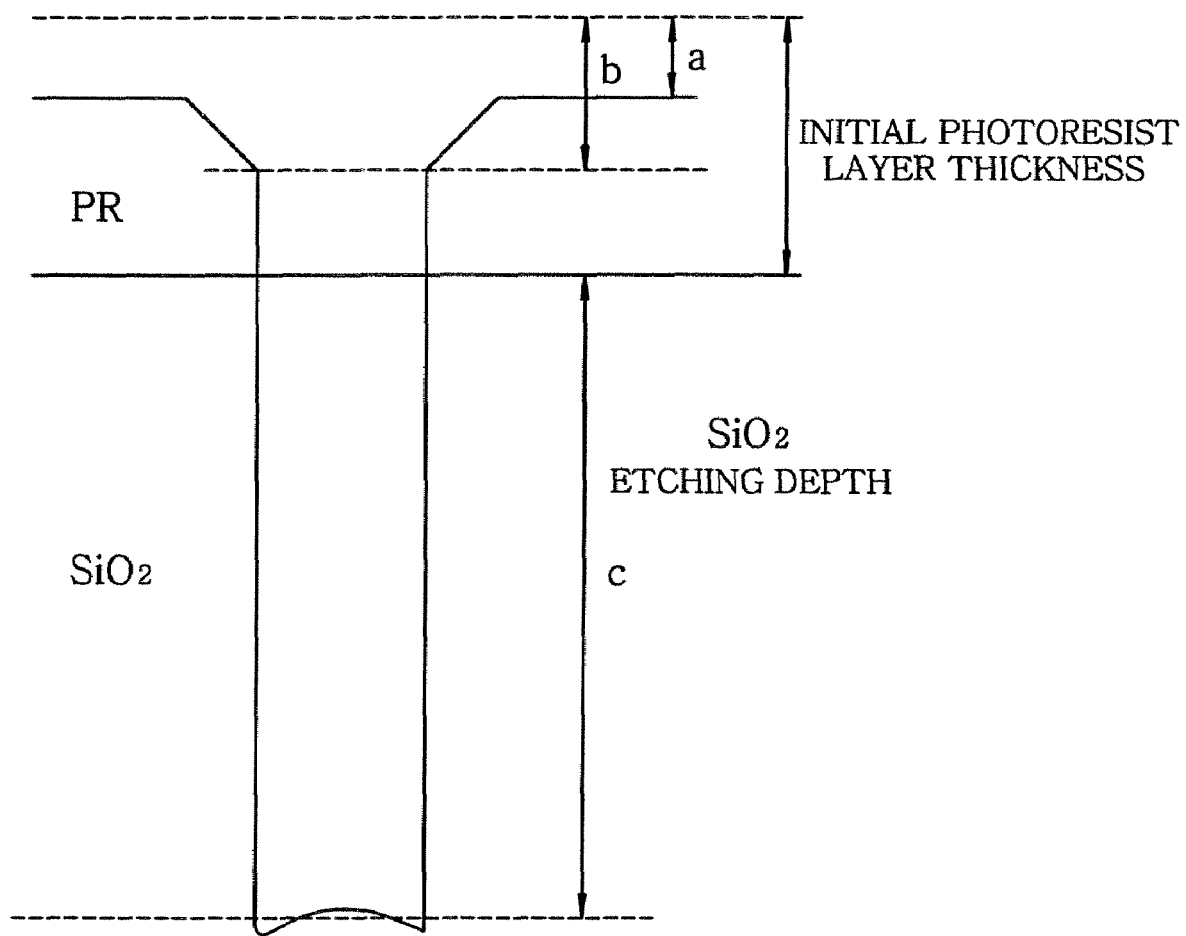
FIG. 3 presents a diagram to explain definitions of an etching rate and a selectivity at a shoulder portion.

Here, the etching rate of the $SiO_2$ layer is a value obtained by an etching depth c of an etched hole divided by an etching time, as illustrated in FIG. 3. Further, the shoulder portion is an obliquely etched portion (facet portion) formed at the opening of the photoresist, as shown in FIG. 3, and the selectivity of the shoulder portion refers to a ratio c/b between the etching depth c and a thickness decrement b of the shoulder portion of the photoresist P.R. with respect to an initial photoresist film thickness.

TEST EXAMPLE 2

In Test Example 2, a plasma etching was performed under the same processing conditions as those for the Test Example 1 with an exception that an etching gas was changed to $C_4F_6/C_6F_{14}/Ar/O_2$ by replacing the $C_5F_{12}$ of the etching gas of the Test Example 1 with $C_6F_{14}$, wherein the flow rates of the $C_4F_6/C_6F_{14}/Ar/O_2$ gases were set to be 20/10/300/24 sccm. Consequently, an etching rate of a $SiO_2$ layer at a hole portion was estimated to be 746 nm/min, and a selectivity of the $SiO_2$ layer against a photoresist was measured to be 4.7 at a shoulder portion. That is, also in the Test Example 2, an etching rate and a $SiO_2$ selectivity substantially equivalent to those that were obtained in the Test Example 1 could be achieved (precisely, the etching rate of the Test Example 2 was slightly higher than the etching rate of the Test Example 2).

COMPARATIVE EXAMPLE 1

In Comparative Example 1, a plasma etching was performed under the same processing conditions as those for the Test Examples 1 and 2 with an exception that an etching gas was changed to $C_4F_6/Ar/O_2$ by omitting the second fluorocarbon gases $C_5F_{12}$ and $C_6F_{14}$ from the etching gases of the Test Example 1 and Test Example 2, respectively, wherein flow rates of the $C_4F_6/Ar/O_2$ gases were set to be 20/300/18 sccm. As a result, an etching rate of a $SiO_2$ layer at a hole portion was estimated to be 570 nm/min, and a selectivity of the $SiO_2$ layer against a photoresist was measured to be 5.5 at a shoulder portion thereof.

COMPARATIVE EXAMPLE 2

In Comparative Example 2, a plasma etching was performed under the same processing conditions as those for the Test Examples 1 and 2 with an exception that an etching gas was changed to $C_4F_6/CF_4/Ar/O_2$ by replacing the second fluorocarbon gases $C_5F_{12}$ and $C_6F_{14}$ of the etching gases of the Test Example 1 and Test Example 2 with $CF_4$, respectively, wherein flow rates of the $C_4F_6/CF_4/Ar/O_2$ gases were set to be 20/10/300/20 sccm. As a result, an etching rate of a $SiO_2$ layer at a hole portion was estimated to be 646 nm/min, and a selectivity of the $SiO_2$ layer against a photoresist was measured to be 4.7 at a shoulder portion thereof.

COMPARATIVE EXAMPLE 3

In Comparative Example 2, a plasma etching was performed under the same processing conditions as those for the Test Examples 1 and 2 excepting that an etching gas was changed to $C_4F_6/C_3F_8/Ar/O_2$ by replacing the second fluorocarbon gases $C_5F_{12}$ and $C_6F_{14}$ of the etching gases of the Test Example 1 and Test Example 2 with $C_3F_8$, respectively, wherein flow rates of the $C_4F_6/C_3F_8/Ar/O_2$ gases were set to be 20/10/300/20 sccm. As a result, an etching rate of a $SiO_2$ layer at a hole portion was estimated to be 696 nm/min, and a selectivity of the $SiO_2$ layer against a photoresist was measured to be 4.7 at a shoulder portion thereof.

Table 1 shows results of the above experiments. As can be seen from Table 1, in the Test Examples 1 and 2, the etching rates could be increased by about 170 nm/min, about 100 nm/min and about 50 nm/min from the etching rates of the Comparative Examples 1 to 3, respectively, while obtaining the substantially same levels of $SiO_2$ selectivity as those of the Comparative Examples 1 to 3.

TABLE 1

|  | Gas Used | Etching Rate nm/min | Selectivity (Shoulder) |
| --- | --- | --- | --- |
| Test Example 1 | $C_5F_{12}$ | 742 | 4.7 |
| Test Example 2 | $C_6F_{14}$ | 746 | 4.7 |
| Comparative Example 1 | None | 570 | 5.4 |
| Comparative Example 2 | $CF_4$ | 646 | 4.9 |
| Comparative Example 3 | $C_3F_8$ | 696 | 4.7 |

Further, in the Test Example 1, etching was performed on the same target object under the same processing conditions, while varying the flow rate of the oxygen gas among the processing gas in order to investigate the margin of the oxygen gas flow rate. The results are shown in Table 2.

TABLE 2

| Oxygen Flow Rate sccm | Etching Rate nm/min | Selectivity (Shoulder) |
| --- | --- | --- |
| 20 | 655 | 4.7 |
| 22 | 722 | 4.7 |
| 23 | 742 | 4.7 |
| 24 | 640 | 3.1 |

As shown in Table 2, when the oxygen gas flow rate ranges from 22 to 23 sccm, a maximum etching rate could be obtained. However, if the oxygen gas flow rate was increased over this range, the etching rate was observed to decrease. Etching rates higher than those of the Comparative Examples 1 and 2 could be obtained when the oxygen gas flow rate was in a range from 20 to 24 sccm. Thus, it is preferable to set the oxygen gas flow rate to be in a range from 20 to 24 sccm and a flow rate ratio of $C_4F_6: C_5F_{12}:O_2$ to be about 2:1:2.0 to 2.4.

Further, in the Test Example 2, etching was performed on the same target object under the same processing conditions, while varying the flow rate of the oxygen gas among the processing gas in order to investigate the margin of the oxygen gas flow rate. The results are shown in Table 3.

TABLE 3

| Oxygen Flow Rate sccm | Etching Rate nm/min | Selectivity (Shoulder) |
| --- | --- | --- |
| 20 | 348 Etching Stop | 2.2 |
| 22 | 653 | 4.0 |
| 24 | 746 | 4.7 |
| 26 | 749 | 4.2 |

As shown in Table 3, when the oxygen gas flow rate ranges from 24 to 26 sccm, a maximum etching rate can be obtained, though the selectivity is observed to deteriorate when the oxygen gas flow rate is set at 26 sccm. On the other hand, if the oxygen gas flow rate is reduced below this range, the etching rate is found to decrease, and if the oxygen gas flow rate is below 22 sccm, for example, 20 sccm, etch stop is observed to occur. Thus, it is preferable to set the oxygen gas flow rate to be in a range from 22 to 26 sccm and a flow rate ratio of $C_4F_6:C_6F_{14}:O_2$ to be about 2:1:2.2 to 2.6.

In accordance with the embodiment of the present invention as described above, an etching rate can be improved while obtaining a high selectivity of a silicon-containing dielectric layer against an organic photoresist film during a plasma etching which is performed in the course of manufacturing semiconductor devices. Thus, a high etching rate and a high selectivity can be both achieved. Here, it is to be noted that the present invention can be modified in various ways without being limited to the embodiment as described above. For example, the plasma etching apparatus is not limited to the parallel plate type plasma etching apparatus as shown in FIG. 2 in which high frequency powers are applied to the upper and the lower electrode, respectively; but, instead, a plasma etching apparatus of a type in which tow different high frequency powers are applied to a lower electrode can be employed, or any of various other types of plasma etching apparatuses can be utilized.

While the invention has been shown and described with respect to the embodiment, it will be understood by those skilled in the art that various changes and modifications may be made without departing from the scope of the invention as defined in the following claims.

What is claimed is:
1. A plasma etching method comprising the step of:
performing a plasma etching on a silicon-containing dielectric layer formed on a substrate to be processed by using a plasma, while using an organic layer as a mask, wherein the plasma is generated from a processing gas at least including a first fluorocarbon gas which is an unsaturated gas; a second fluorocarbon gas which is an aliphatic saturated gas expressed by $C_mF_{2m+2}$ (m=5, 6); and an oxygen gas.

2. The plasma etching method of claim 1, wherein the first fluorocarbon gas is $C_4F_6$ and the second fluorocarbon gas is $C_5F_{12}$, and
 a flow rate ratio between the $C_4F_6$, the $C_5F_{12}$ and the oxygen gas is about 2:1:2.0 to 2.4.

3. The plasma etching method of claim 1, wherein the first fluorocarbon gas is $C_4F_6$ and the second fluorocarbon gas is $C_6F_{14}$, and
 a flow rate ratio between the $C_4F_6$, the $C_6F_{14}$ and the oxygen gas is about 2:1:2.2 to 2.6.

4. The plasma etching method of claim 1, wherein the organic layer is a photoresist layer, and the silicon-containing dielectric layer is a silicon oxide layer.

5. The plasma etching method of claim 1, wherein the processing gas further contains a rare gas.

6. The plasma etching method of claim 5, wherein the rare gas is an argon gas.

7. The plasma etching method of claim 1, wherein the plasma etching is performed, in a processing chamber having a lower electrode for mounting the substrate to be processed thereon and an upper electrode disposed to face the lower electrode, by applying high frequency powers between the upper and the lower electrode.

8. The plasma etching method of claim 7, wherein the high frequency powers include a first high frequency power applied to the upper electrode; and a second high frequency power applied to the lower electrode, wherein a frequency of the second high frequency power is lower than that of the first high frequency power.

9. The plasma etching method of claim 1, wherein during performing the plasma etching, a hole is formed in the silicon-containing dielectric layer by using the plasma through the organic layer serving as the mask so that an upper surface of the substrate is exposed through the hole.

10. The plasma etching method of claim 9, wherein the hole is a contact hole.

11. The plasma etching method of claim 1, wherein the mask has an opening portion and a masked portion and during performing the plasma etching, a portion of the silicon-containing dielectric layer under the opening portion is etched so that an upper surface of the substrate is exposed through the opening portion and a portion of the silicon-containing dielectric layer under the masked portion is not etched to remain thereunder.

* * * * *